(12) United States Patent
Hwang

(10) Patent No.: US 7,391,911 B2
(45) Date of Patent: Jun. 24, 2008

(54) METHOD AND APPARATUS FOR COMPRESSING HOLOGRAPHIC DATA

(75) Inventor: Euiseok Hwang, Seoul (KR)

(73) Assignee: Daewoo Electronics Corp., Seoul (KR)

( * ) Notice: Subject to any disclaimer, the term of this patent is extended or adjusted under 35 U.S.C. 154(b) by 732 days.

(21) Appl. No.: 10/860,510

(22) Filed: Jun. 4, 2004

(65) Prior Publication Data

US 2004/0263926 A1 Dec. 30, 2004

(30) Foreign Application Priority Data

Jun. 20, 2003 (KR) ............... 10-2003-0043169

(51) Int. Cl.
*G06K 9/36* (2006.01)
*G06K 7/10* (2006.01)
*G03H 1/00* (2006.01)

(52) U.S. Cl. .............. 382/232; 359/1; 235/457

(58) Field of Classification Search ........... 341/56, 341/59, 61, 82, 102; 382/210–211, 232–253; 359/1–35; 355/2; 365/120–125, 215, 216; 235/454–457

See application file for complete search history.

(56) References Cited

U.S. PATENT DOCUMENTS

| | | | | |
|---|---|---|---|---|
| 4,121,259 A * | 10/1978 | Preuss et al. | ............... | 382/246 |
| 4,314,105 A * | 2/1982 | Mozer | ............... | 341/143 |
| 4,546,342 A * | 10/1985 | Weaver et al. | ............... | 341/51 |
| 4,737,765 A * | 4/1988 | Minuhin | ............... | 341/67 |
| 4,841,299 A * | 6/1989 | Weaver | ............... | 341/65 |
| 5,363,418 A * | 11/1994 | Nakano et al. | ............... | 375/369 |
| 5,489,908 A * | 2/1996 | Orthmann et al. | ......... | 340/10.32 |
| 5,657,398 A * | 8/1997 | Guilak | ............... | 382/232 |
| 5,689,588 A * | 11/1997 | Rombola et al. | ............ | 382/237 |
| 6,078,696 A * | 6/2000 | Nguyen et al. | ............. | 382/253 |
| 6,091,853 A * | 7/2000 | Otto | ............... | 382/232 |
| 6,205,252 B1 * | 3/2001 | Nguyen et al. | ............. | 382/234 |
| 7,171,053 B2 * | 1/2007 | Van der Vleuten | ......... | 382/244 |
| 2002/0181781 A1 * | 12/2002 | Javidi et al. | ............. | 382/210 |
| 2003/0081848 A1 * | 5/2003 | Wada | ............... | 382/240 |

* cited by examiner

*Primary Examiner*—Bhavesh M. Mehta
*Assistant Examiner*—Manav Seth
(74) *Attorney, Agent, or Firm*—Bacon & Thomas, PLLC

(57) ABSTRACT

An apparatus for compressing holographic data includes an image capture device for capturing an image of an interference pattern reconstructed by irradiating a reference beam and converting the image into m bits. In such an apparatus, a splitter removes least significant j bits from the m-bit data and divides m−j bits of the m-bit data into most significant k bits and remaining m−j−k bits. Thereafter, a compressor converts the most significant k bits into l bits, which is combined with the m−j−k bits to output n bits, wherein l<k and n=l+m−j−k. In this way, by compressing a certain number of most significant bits of the m-bit data and thus relatively increasing the number of the remaining least significant bits of the m-bit data, the BER of final reconstructed image data can be improved.

6 Claims, 6 Drawing Sheets

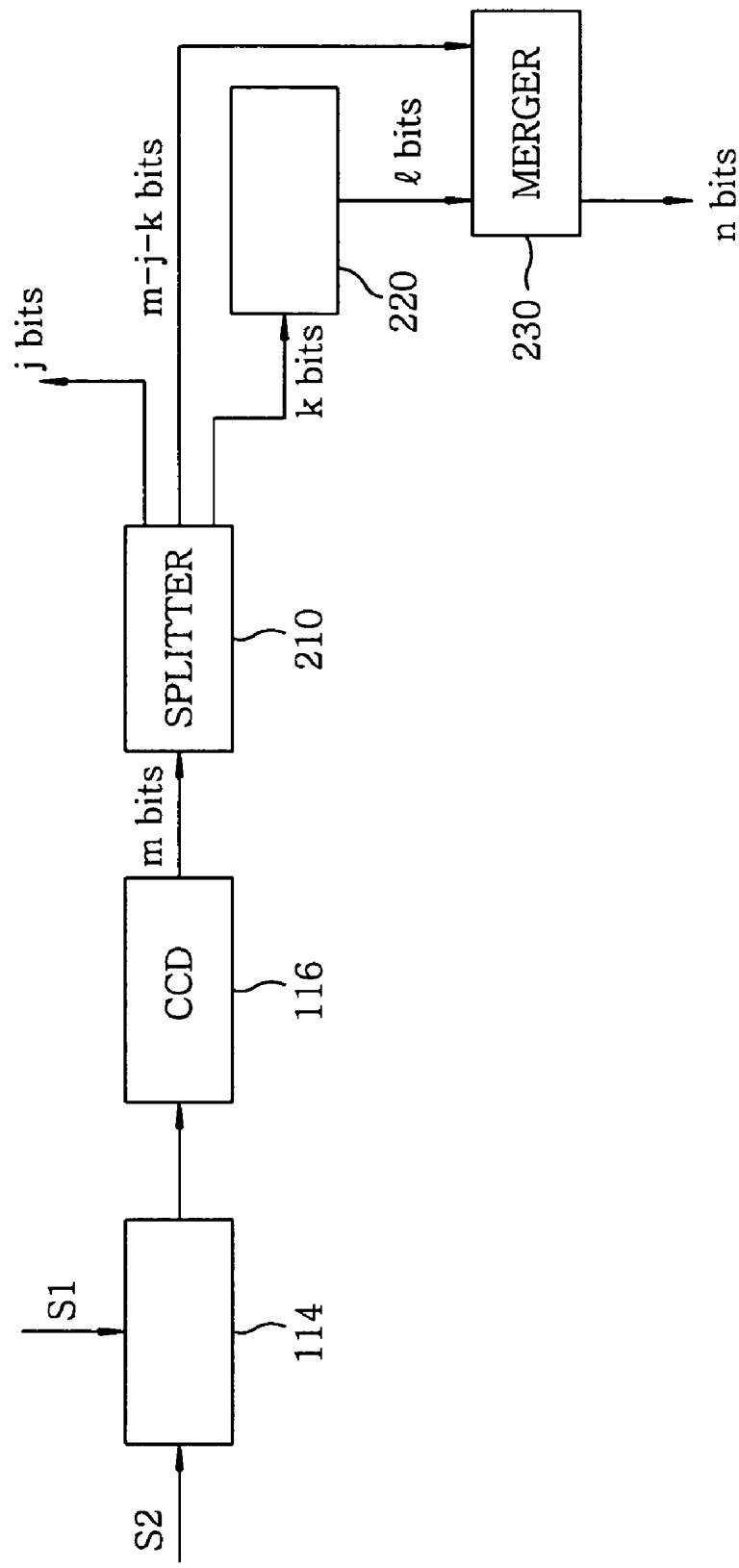

3:2 COMPRESSION TABLE

| INPUT | | | OUTPUT | |
|---|---|---|---|---|
| $d_{11}$ | $d_{10}$ | $d_9$ | $c_7$ | $c_6$ |
| 1 | × | × | 1 | 1 |
| 0 | 1 | 1 | 1 | 1 |
| 0 | 1 | 0 | 1 | 0 |
| 0 | 0 | 1 | 0 | 1 |
| 0 | 0 | 0 | 0 | 0 |

FIG.4A

5:3 COMPRESSION TABLE

| INPUT | | | | | OUTPUT | | |
|---|---|---|---|---|---|---|---|
| $d_{11}$ | $d_{10}$ | $d_9$ | $d_8$ | $d_7$ | $c_7$ | $c_6$ | $c_5$ |
| 1 | × | × | × | × | 1 | 1 | 1 |
| 0 | 1 | 1 | × | × | 1 | 1 | 1 |
| 0 | 0 | 1 | × | × | 0 | × | × |
| 0 | 1 | 0 | × | × | 1 | × | × |
| 0 | 0 | 0 | × | × | 0 | 0 | 0 |

METHOD AND APPARATUS FOR COMPRESSING HOLOGRAPHIC DATA

FIELD OF THE INVENTION

The present invention relates to a holographic data reconstruction system; and, more particularly, to a method and an apparatus for compressing holographic data reconstructed in a storage medium while minimizing a bit error rate (BER) of the data by performing a simple bit operation on the data.

BACKGROUND OF THE INVENTION

A holographic data storage and reconstruction system records an interference pattern in a storage medium, e.g., a photorefractive polymer, that is sensitively reactive to an amplitude of the interference pattern, and reconstructs the recorded interference pattern, wherein the interference pattern is produced by the interference of a reference beam and a signal beam that is generated from a target object. In such a holographic data storage and reconstruction system, the amplitude and phase of the signal beam are recorded therein by varying an incident angle of the reference beam, thereby reconstructing a three-dimensional shape of the object. Moreover, it is possible to store in the same storage medium a large quantity of page-based holographic data composed of binary data.

FIG. 1 shows a diagram of a conventional holographic storage and reconstruction system for storing in a holographic medium a three-dimensional hologram data (i.e., an interference pattern) produced by the interference of a signal beam with a reference beam and then reconstructing the three-dimensional hologram data stored in the holographic medium.

As illustrated in FIG. 1, the conventional holographic data storage and reconstruction system includes a light source 100 for emitting a laser beam and a holographic medium 114 for storing therein hologram data. Formed between the light source 100 and the storage medium 114 are two paths, i.e., a signal beam processing path S1 and a reference beam processing path S2, each including a plurality of optical systems.

Referring to FIG. 1, there is illustrated a beam splitter 102 for splitting an incident laser beam emitted from the light source 100 into a reference beam and a signal beam. The reference beam is reflected and then provided to the reference beam processing path S2 whereas the signal beam passes through the beam splitter 102 and then is provided to the signal beam processing path S1.

The reference beam provided to the reference beam processing path S2 is reflected by a mirror 108, and the reflected reference beam enters the holographic medium 114 via an optical system 112 composed of optical lenses.

Meantime, on the reference processing path S2, the mirror 108 operated by an actuator 110 deflects a reference beam at a predetermined angle, i.e., a recording angle or a reconstruction angle, and then provides the deflected reference beam to the storage medium 114. Herein, the reconstruction angle used for reconstructing the recorded data should be identical to the recording angle used for recording the data.

Provided on the signal beam processing path S1 are sequentially a spatial light modulator (SLM) 104, a mirror 106 and an optical lens 107 in a direction of the signal beam incident on the holographic medium 114.

On the signal beam processing path S1, the SLM 104 modulates the signal beam into a page-based data composed of a plurality of pixels representing binary data based on an externally inputted data. The modulated signal beam is then reflected by a mirror 106 and then provided to the holographic medium 114 via the optical lens 107.

In this way, the signal beam and the reference beam entering the holographic medium 114 respectively along the signal beam processing path S1 and the reference beam processing path S2 interfere with each other in the holographic medium 114. Depending on the amplitude of the interference pattern produced by the interference, a photo-induced transformation occurs in the holographic medium 114, thereby the interference pattern being recorded in the holographic medium 114.

The data recorded in the holographic medium 114 during the above-described holographic data recording process is reconstructed as follows.

That is, if the reference beam, i.e., the reconstructing reference beam, is illuminated on the holographic medium 114 in order to read out the data recorded in the holographic medium 114, the reconstructing reference beam is diffracted by the interference pattern recorded in the storage medium 114. As a result, the page-based data (signal beam) composed of a plurality of pixels representing binary data is restored, and an image of the restored signal beam is captured by a CCD 116.

The CCD 116 converts each pixel level of the captured image (page) into a series of m-bit binary data and then outputs the binary data to a splitter 118. The splitter 118 removes a least significant a ($0 \leq a < m$) bits from the m-bit data outputted from the CCD 116 and then outputs a remaining m−a bits. Herein, although the data outputted by the CCD 116 is assumed to be digital data, the output data can be an analog data. In case the output data is the analog data, an A/D converter can be additionally connected between an output of the CCD 116 and the splitter 118.

The m−a bit data outputted by the splitter 118 is converted into binary data '0' or '1', thereby ultimately restoring the page-based data composed of the binary data. For example, such conversion can be carried out by applying a modulation code to the m−a bit data. Further, by comparing the m−a bit data with a predetermined threshold, in case the m−a bit data is greater than the threshold, the data is converted into a binary data '1' whereas in case the m−a bit data is smaller than or equal to the threshold, the data is converted into a binary data '0'.

The data reconstructed by the conventional apparatus for storing and reconstructing the holographic data is an image data composed of 1K to 1M pixels included in hundreds to thousands of frames per second. However, the holographic data reconstruction system should restore the original page-based data by processing the outputted image data within a limited time.

The amount of data to be processed by the holographic data reconstruction system increases in proportion to the number (m) of bits of data outputted by the CCD 116. Therefore, it is preferable to reduce the amount of data to be processed by increasing the number of the least significant a bits removed from the m-bit data outputted by the CCD 116. However, the conventional holographic data reconstruction system has a drawback in that the bit error rate (BER) of binary data representing the outputted page-based data increases as the number (a) of the removed bits increases.

SUMMARY OF THE INVENTION

It is, therefore, an object of the present invention to provide a method and an apparatus for compressing holographic data reconstructed in a holographic data storage and reconstruction system by compressing a certain number of most significant bits of each pixel of the holographic data and thus relatively increasing the number of the remaining least significant bits of the pixel, wherein the compressed most significant bits have little affect on the quality of the reconstructed image data, thereby minimizing the BER of the reconstructed image data.

In accordance with one aspect of the invention, there is provided+Claim.

In accordance with another aspect of the invention, there is provided+Claim.

BRIEF DESCRIPTION OF THE DRAWINGS

The above and other objects and features of the present invention will become apparent from the following description of preferred embodiments, given in conjunction with the accompanying drawings, in which:

FIG. 2 illustrates an apparatus for compressing holographic data in accordance with a preferred embodiment of the present invention;

FIG. 4A presents a table indicating an exemplary bit compression relation (5:3) in accordance with the present invention;

DETAILED DESCRIPTION OF THE PREFERRED EMBODIMENTS

Figure 1:
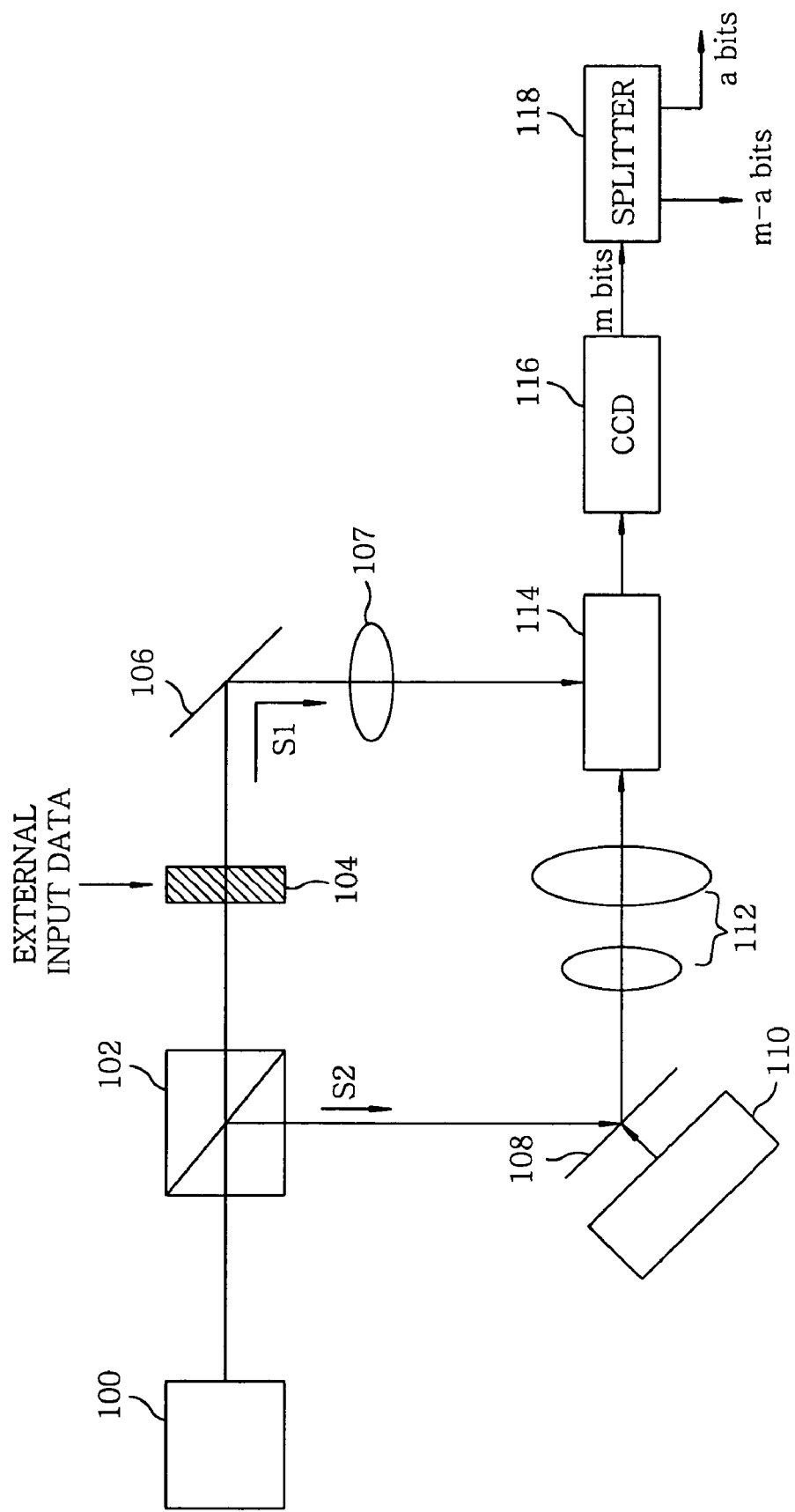
FIG. 1 is a block diagram showing a conventional holographic data storage and reconstruction system.

Hereinafter, the preferred embodiment of the present invention will be described in detail with reference to the accompanying drawings. Detailed explanations of parts identical or similar to those described with respect to the conventional holographic data storage and reconstruction system will be omitted in describing a holographic data storage and reconstruction system in accordance with the present invention, and like reference numerals will be used therefor.

FIG. 2 illustrates an apparatus for compressing holographic data, which is included in a holographic data storage and reconstruction system in accordance with a preferred embodiment of the present invention. Although it is not specifically described in FIG. 2, the holographic data storage and reconstruction system in accordance with the present invention includes a light source 100 for emitting a laser beam and a holographic medium 114 for storing therein a hologram data, as illustrated in FIG. 1. Further, formed between the light source 100 and the storage medium 114 are two paths, i.e., a signal beam processing path S1 and a reference beam processing path S2, including a plurality of optical systems.

Holographic data recorded in the holographic medium 114 is reconstructed by performing following steps. That is, if only a reference beam, i.e., a reconstructing reference beam, is illuminated on the holographic medium 114 to read out the data recorded in the holographic medium 114, the reconstructing reference beam is diffracted by an interference pattern recorded in the storage medium 114. Thus, the page-based data (signal beam) composed of a plurality of pixels representing binary data is restored and, further, an image of the restored signal beam is captured by the CCD 116.

The CCD 116 converts each pixel level of the captured image (page) into m-bit (m>0) binary data and then outputs the binary data to the splitter 210. Herein, the m-bit binary data is ultimately converted into binary data ('0' or '1') representing brightness of an interference pattern recorded in the holographic medium 114 by using a normalization process to be described later. The accuracy of classifying the m-bit data into two areas ('0' or '1') is determined by a degree of classifying information (hereinafter referred to "classification resolution") included in the least significant bits of the data. Meanwhile, the most significant bits of the data provides an approximate criterion for determining an area to which the m-bit data belongs. Accordingly, in the apparatus for compressing holographic data in accordance with the preferred embodiment of the present invention, most significant bits of the m bits outputted by the CCD 116 are compressed. Thus, the more the most significant bits are compressed, the more the least significant bits of the m bits may be used to classify the m-bit data into two areas ('0' or '1'), thereby increasing the classifying resolution.

In particular, after removing j ($0 \leq j < m$) least significant bits from the m-bit data outputted by the CCD 116, a splitter 210 provides most significant k bits among m−j bits to the compressor and outputs the remaining (m−j−k) bits to a merger 230. The compressor 220 compresses the inputted k-bit data into l-bit (l<k) data and then provides the l-bit data to the merger 230. Thereafter, the merger 230 combines the inputted l-bit data with the (m−j−k)-bit data to thereby output n-bit (n=m−j−k+l) data.

The n-bit data outputted by the merger 230 is converted into binary data '0' or '1', so that the page-based data composed of binary data representing brightness is finally restored. For example, such conversion can be performed by applying a modulation code to the n-bit data. Further, by comparing the n-bit data with a predetermined threshold, in case the n-bit data is greater than the threshold, it is modulated into binary data '1' whereas in case the n-bit data is smaller than or equal to the threshold, it is modulated into binary data '0'.

The compressor 220 compresses the most significant k bits among the m-bit data outputted by the CCD 116 by using a combinational logic circuit to thereby output the l-bit (l<k) data. The logic circuit of the compressor 220 can be determined by following steps.

Figures 3A, 3B:
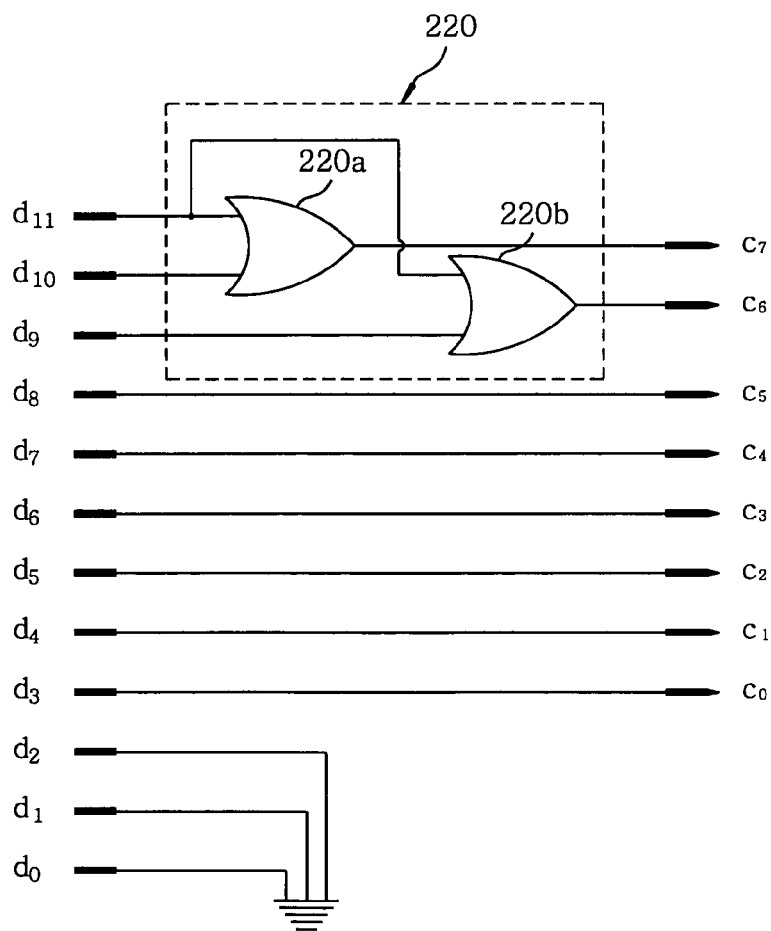
FIG. 3A provides a table showing an exemplary bit compression relation (3:2) in accordance with the present invention.
FIG. 3B describes a circuit diagram of an apparatus for compressing holographic data by employing a combinational logic circuit based on the compression relation of the table shown in FIG. 3A.

For instance, in case k and l are respectively 3 and 2, a logic circuit of the compressor 220 may be constructed as follows. First, as illustrated in FIG. 3A, a compression table is prepared for transforming 3-bit data $d_{11}d_{10}d_9$, which is inputted into the compressor 220, into 2-bit data $c_7c_6$. The compression table may be prepared based on a distribution of the m-bit (m=12) data (a pixel level of an image captured by the CCD 116) outputted by the CCD 116. For example, as can be seen from the compression table illustrated in FIG. 3A, in case the 3-bit data $d_{11}d_{10}d_9 \geq 011$, it is compressed into the 2-bit data $c_7c_6=11$. Further, in case the 3-bit data $d_{11}d_{10}d_9<011$, it is compressed into one of several 2-bit data. That is, the 3-bit data $d_{11}d_{10}d_9$ 010, 001 and 000 are compressed into the 2-bit data $c_7c_6$ 10, 01, 00, respectively. This means that the m-bit data having its most significant bits $d_{11}d_{10}d_9<011$ is more densely distributed.

Once the compression table as shown in FIG. 3A is determined, a logic expression representing the input/output relationship illustrated in the compression table is obtained and further implemented by using a combinational logic circuit. A process for designing the combinational logic circuit based on the input/output relationship may be carried out by using any one of well-known logic circuit design methods. FIG. 3B provides a layout of a combinational logic circuit implementing the compressor 220 based on the input/output relationship of the compression table shown in FIG. 3A. As shown in FIG.

3B, the most significant k (k=3) bits $d_{11}d_{10}d_9$ among the m=12 bit data $d_{11}d_{10} \ldots d_1d_0$ outputted by the CCD 116 is compressed into l=2 bit $c_7c_6$ by the compressor 220, and the least significant j (j=3) bits $d_2d_1d_0$ are deleted. Moreover, an intermediate (m−j−k) bit data $d_8d_7d_6d_5d_4d_3$ among the m=12 bit data $d_{11}d_{10} \ldots d_1d_0$ outputted by the CCD 116 is combined with the l=2 bit data $c_7c_6$ by the merger 230, thereby outputting an n=8 bit data $c_7c_6c_5c_4c_3c_2c_1c_0$.

Figure 4B:
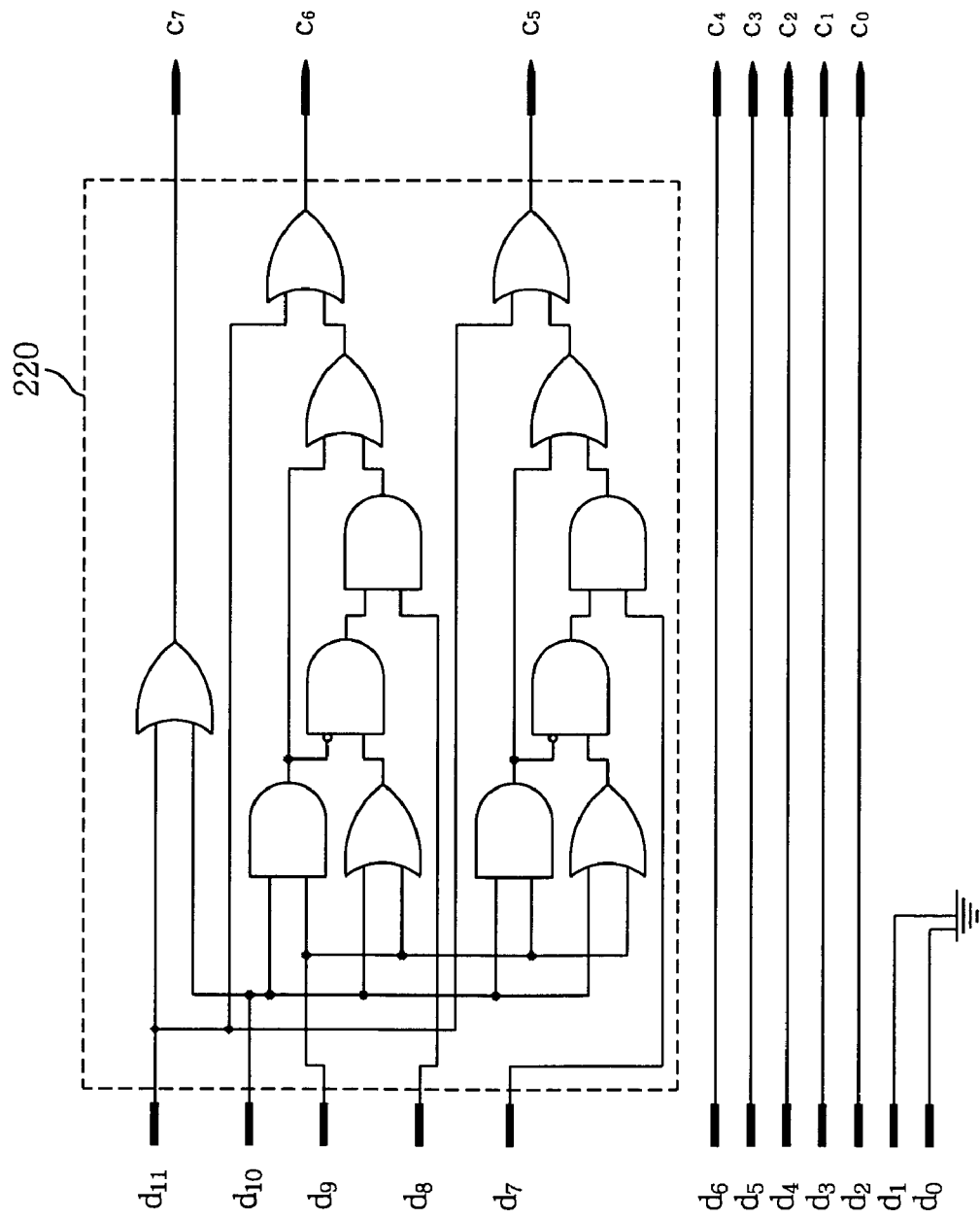
FIG. 4B represents a circuit diagram showing an apparatus for compressing holographic data by employing a combinational logic circuit based on the compression relation of the table illustrated in FIG. 4A.

In the meantime, FIG. 4A presents a compression table showing a conversion of 5-bit data $d_{11}d_{10}d_9d_8d_7$, which is inputted into the compressor 220, into 3-bit data $c_7c_6c_5$. As described with reference to FIG. 3A, the compression table can be determined based a distribution of the m-bit (m=12) data (a pixel level of an image captured by the CCD 116). FIG. 4B represents a layout of a combinational logic circuit implementing the compressor 220 based on the input/output relationship of the compression table shown in FIG. 4A. As can be seen from FIG. 4B, the most significant k (k=5) bits $d_{11}d_{10}d_9d_8d_7$ among the m-bit (m=12) data $d_{11}d_{10} \ldots d_1d_0$ outputted by the CCD 116 is compressed into l (l=3) bits $c_7c_6c_5$ by the compressor 220, and the least significant j (j=2) bits $d_1d_0$ are deleted. In addition, an intermediate (m−j−k)-bit data $d_6d_5d_4d_3d_2$ among the m-bit data $d_{11}d_{10} \ldots d_1d_0$ outputted by the CCD 116 is combined with the l-bit data $c_7c_6c_5$ by the merger 230, thereby outputting n-bit (n=8) data $c_7c_6c_5c_4c_3c_2c_1c_0$.

Figure 5:
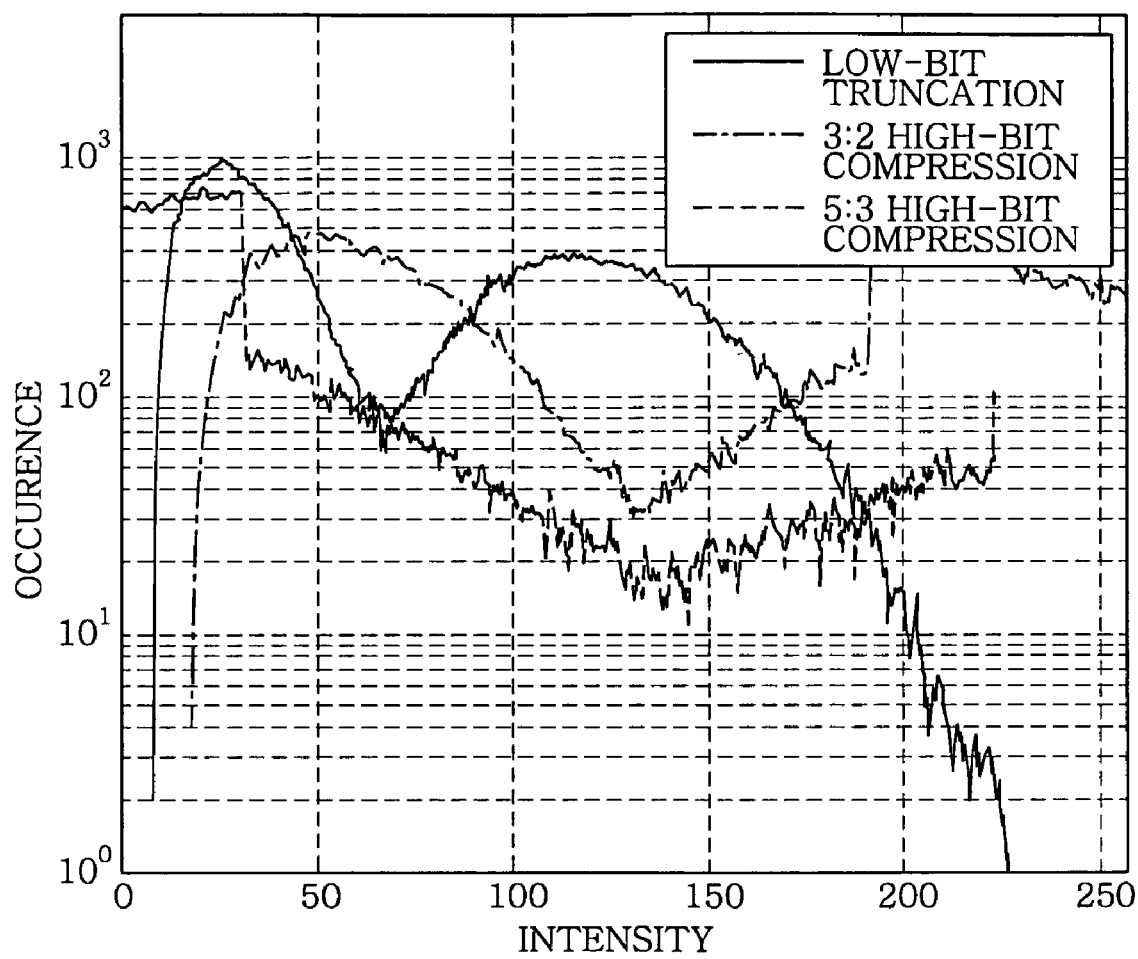
FIG. 5 offers a graph illustrating a distribution of a compressed holographic data obtained respectively by removing least significant bits thereof in accordance with the prior art and by compressing most significant bits thereof in accordance with the present invention.

FIG. 5 offers a graph indicating a distribution of n-bit (n=m−a=8) data outputted by truncating least significant a (a=4) bits of m-bit (m=12) data $d_{11}d_{10} \ldots d_1d_0$ outputted by the CCD 116 in accordance with the prior art and that of n-bit data obtained by using an apparatus for compressing holographic data in accordance with the present invention as illustrated in FIGS. 3A to 4B. As illustrated in FIG. 5, in both the cases where the most significant k1 (k1=5) bits and the most significant k2 (k2=3) bits are respectively compressed into 3 bits and 2 bits in accordance with the present invention, the classification resolution of the outputted n-bit data is improved in comparison with the case where the least significant a (a=4) bits are truncated in accordance with the prior art.

In distribution curves shown in FIG. 5, a criterion, i.e., a threshold, for classifying the compressed n-bit data into two areas ('0' or '1') can be determined as a point where two ridge-shaped curves interests. Referring to FIG. 5, in case of employing the prior art method, the threshold is found to be about 70. On the other hand, in case of using the method in accordance with the present invention, the threshold is determined to be about 130. Therefore, in case the compressor in accordance with the present invention is used, the compressed n-bit data reflects more precisely a distribution of the m-bit data outputted by the CCD 116. Furthermore, the number of the compressed n-bit data distributed near the threshold in accordance with the present invention is lower than the number of those distributed near the threshold in accordance with the prior art. This means that the classifying resolution is improved in case of using the compressor in accordance with the present invention.

In the examples shown in FIG. 5, images having 240×240 pixels were captured by the CCD 116 and each pixel (m=12 bits) of the images was compressed into n=8 bit data. Next, the compressed data was classified into one of two bit values ('0' or '1') and then a counted error rate (CER) indicating the number of wrong classifications was calculated. In case the least significant a=4 bit was truncated in accordance with the prior art, the CER of 0.92% was obtained. On the other hand, in case the most significant bits of the m=12 bit data were compressed with the ratios of 5:3 and 3:2 by using the compressor in accordance with the present invention, the CER of 0.85% was obtained. Such a result of the present invention is almost the same as that (0.84%) obtained after classifying the uncompressed m=12 bit data into two bit values ('0' or '1'), which means that the CER is improved in case of using the compressor in accordance with the present invention.

As described above, in accordance with the present invention, holographic data can be effectively compressed by compressing a certain number of most significant bits of each pixel of the holographic data and thus relatively increasing the number of the remaining least significant bits of the pixel, wherein the compressed most significant bits have little affect on the quality of final reconstructed image data, thereby minimizing the BER of the reconstructed image data.

While the invention has been shown and described with respect to the preferred embodiments, it will be understood by those skilled in the art that various changes and modifications may be made without departing from the spirit and scope of the invention as defined in the following claims.

What is claimed is:

1. An apparatus for compressing holographic data including an image capture device for capturing an image of an interference pattern reconstructed by irradiating a reference beam on a holographic medium and converting the captured image into a series of m-bit data, where m>l, comprising:
   a splitter for removing least significant j bits from the m-bit data and dividing m−j bits of the m-bit data into most significant k bits and remaining m−j−k bits;
   a compressor for compressing the most significant k bits into l bits; and
   a merger for combining the l bits outputted by the compressor and the m−j−k bits outputted by the splitter to output n bits,
   wherein m, j, k, l and n represent positive integers and l<k and n=l+m−j−k.

2. The apparatus of claim 1, wherein a transform relation in which the k bits are compressed into the l bits by the compressor is determined such that a distribution of the n-bit data reflects that of the m-bit data.

3. The apparatus of claim 2, wherein the compressor is implemented by using a combinational logic circuit representing the transform relation in which the k bits is compressed into the l bits.

4. A method for compressing holographic data, which captures an image of an interference pattern reconstructed by irradiating a reference beam on a holographic medium and converting the captured image into a series of m-bit data, comprising the steps of:
   (a) removing least significant bits from the m-bit data and then dividing m−j bit of the m-bit data into most significant k bits and remaining m−j−k bits;
   (b) compressing the most significant k bits into l bits; and
   (c) combining the l bits with the m−j−k bits to generate n bits,
   wherein m, j, k, l and n represent positive numbers and l<k and n=l+m−j−k.

5. The method of claim 4, wherein, in the step (b), a transform relation in which the k bits are compressed into the l bits is determined such that a distribution of the n-bit data reflects that of the m-bit data.

6. The method of claim 5, wherein the step (b) is performed by using a logic operation representing the transform relation in which the k bits are compressed into the l bits.

* * * * *

UNITED STATES PATENT AND TRADEMARK OFFICE
CERTIFICATE OF CORRECTION

PATENT NO. : 7,391,911 B2  
APPLICATION NO. : 10/860510  
DATED : June 24, 2008  
INVENTOR(S) : Euiseok Hwang Page 1 of 1

It is certified that error appears in the above-identified patent and that said Letters Patent is hereby corrected as shown below:

Title Page, Item (30) For. Appl. Prio. Data:  
Please change the filing date from  
"June 20, 2003" to --June 30, 2003--.

Col. 6, Line 47, in step (a) of claim 4,  
Please change "removing least significant bits" to  
--removing least significant j bits--.

Signed and Sealed this

Second Day of June, 2009

JOHN DOLL  
*Acting Director of the United States Patent and Trademark Office*